United States Patent
Yang

(10) Patent No.: US 10,927,455 B2
(45) Date of Patent: Feb. 23, 2021

(54) ASSEMBLY OF CHAMBER LID AND CEILING FOR SEMICONDUCTOR PROCESSES AND FILM DEPOSITION

(71) Applicant: HERMES-EPITEK CORPORATION, Taipei (TW)

(72) Inventor: Chih-Kuo Yang, Taipei (TW)

(73) Assignee: HERMES-EPITEK CORPORATION, Taipei (TW)

( * ) Notice: Subject to any disclaimer, the term of this patent is extended or adjusted under 35 U.S.C. 154(b) by 130 days.

(21) Appl. No.: 16/044,809

(22) Filed: Jul. 25, 2018

(65) Prior Publication Data
US 2019/0032204 A1    Jan. 31, 2019

(30) Foreign Application Priority Data
Jul. 25, 2017  (TW) .................................. 106124829

(51) Int. Cl.
*C23C 16/44*    (2006.01)
*H01L 21/67*    (2006.01)
(Continued)

(52) U.S. Cl.
CPC ........ *C23C 16/4409* (2013.01); *C23C 16/455* (2013.01); *C23C 16/45563* (2013.01);
(Continued)

(58) Field of Classification Search
None
See application file for complete search history.

(56) References Cited

U.S. PATENT DOCUMENTS 4,523,985 A * 6/1985 Dimock ................ C23C 14/566
                                                    118/50
6,207,006 B1 * 3/2001 Katoh ............... C23C 16/45565
                                                    118/715
(Continued)

FOREIGN PATENT DOCUMENTS

CN    101379214 A    3/2009
CN    101921997 A    12/2010
(Continued)

OTHER PUBLICATIONS

Taiwan Office Action dated Sep. 30, 2018, issued in counterpart Taiwanese Patent Application No. 106124829, 3 pages in Chinese with 1-[age English summary.
(Continued)

*Primary Examiner* — Binu Thomas
(74) *Attorney, Agent, or Firm* — Juan Carlos A. Marquez; Marquez IP Law Office, PLLC

(57) ABSTRACT

An assembly of a chamber lid and a ceiling is used in a film deposition apparatus for semiconductor processes. The assembly comprises a chamber lid, a ceiling and a retaining mechanism. The chamber lid comprises a recession capable of containing the retaining mechanism. The ceiling comprises a plate and a support ring protruding from the middle of the plate. The retaining mechanism comprises a pair of arms, a pair of connecting members respectively connected to the arms, a pair of linkages respectively forcing the connecting members to move along different directions and a driver driving the linkages to move relative to each other. When the connecting members move toward and get close to each other along different directions, the arms accordingly retain the support ring.

11 Claims, 4 Drawing Sheets

(51) Int. Cl.
*C23C 16/455* (2006.01)
*H01L 21/02* (2006.01)

(52) U.S. Cl.
CPC .... *H01L 21/0262* (2013.01); *H01L 21/02538* (2013.01); *H01L 21/6719* (2013.01)

(56) References Cited

U.S. PATENT DOCUMENTS

| | | | | |
|---|---|---|---|---|
| 6,662,673 | B1* | 12/2003 | Olgado | H01L 21/67126 257/E21.175 |
| 2005/0011446 | A1* | 1/2005 | Fink | H01J 37/32458 118/715 |
| 2006/0060138 | A1* | 3/2006 | Keller | H01J 37/3244 118/715 |
| 2006/0108069 | A1 | 5/2006 | Gernert | |
| 2010/0181024 | A1* | 7/2010 | White | C23C 16/45565 156/345.33 |
| 2013/0098554 | A1* | 4/2013 | Chhatre | H01J 37/3244 156/345.27 |
| 2013/0340662 | A1* | 12/2013 | Shinkai | F16J 13/04 114/50 |
| 2017/0081763 | A1* | 3/2017 | Tiner | C23C 16/45565 |
| 2017/0358463 | A1* | 12/2017 | Huang | H01L 21/67126 |
| 2018/0282868 | A1* | 10/2018 | Chuang | C23C 16/45563 |

FOREIGN PATENT DOCUMENTS

| | | |
|---|---|---|
| CN | 102766851 A | 11/2012 |
| CN | 202658271 U | 1/2013 |

OTHER PUBLICATIONS

Taiwan Search Report dated Sep. 30, 2018, issued in counterpart Taiwanese Patent Application No. 106124829, 1-page English summary.

Chinese Office Action dated Apr. 8, 2020, issued in counterpart Chinese Patent Application No. 2018108017-1.3, 6 pages in Chinese.

* cited by examiner

ASSEMBLY OF CHAMBER LID AND CEILING FOR SEMICONDUCTOR PROCESSES AND FILM DEPOSITION

CROSS-REFERENCE TO RELATED APPLICATION

This application claims priority from Taiwan Patent Application No. 106124829 filed on Jul. 25, 2017, which are hereby incorporated herein by reference in its entirety.

BACKGROUND OF THE INVENTION

1. Field of the Invention

The invention relates to a vapor phase film deposition apparatus for forming a thin film on a semiconductor substrate, and particularly, to an assembly of assembly of a chamber lid and a ceiling for semiconductor processes.

2. Description of Related Art

During the formation of a thin film on a semiconductor substrate, the reactor of a film deposition apparatus containing substrates utilizes a gas injector to feed gases, and the gas injector horizontally (or vertically) jets the reaction gasses above a susceptor for mixing. A film is then deposited on each substrate (e.g. a wafer) through physical or chemical reactions induced by heating. The gas injector is designed to horizontally inject the reaction gases and render the reaction gases uniformly distributed on the surface of the rotating substrate so as to form an even boundary layer on the surface of the substrate to facilitate the deposition of thin films.

FIG. 1 is a schematic cross-sectional diagram which shows the conventional reactor of a film deposition apparatus. A film deposition apparatus comprises a reactor 10 for the growth of a vapor phase deposition film. A closed chamber near vacuum is enclosed by chamber walls 11 and a chamber lid 12. A substrate sustaining member 13 is disposed within the chamber, and is used to carry and hold at least one substrate W. A ceiling (i.e. an opposing face member) 14 is disposed opposing to the substrate sustaining member 13. A gas injector 15 is disposed at the center of the chamber lid 12. The gas injector 15 is used to guide and deliver gases such as a mixture of a source gas of $H_2/N_2/$ group V element, a source gas of a group III element, and carrier gas and a source gas of $H_2/N_2/$group V element for semiconductor processes. The gas injector 15 horizontally jets the reaction gasses above a substrate W for mixing. A film is then deposited on each substrate W through physical or chemical reactions induced by heating.

During a deposition process, the temperature of the lower surface of the ceiling 14 attached to the upper side of the chamber lid 12 is preferably controlled to be around 300° C. in order to prevent particles from being accumulated on the lower surface of the ceiling 14 and falling from it to contaminate the wafers. Accordingly, the yield of a wafer is undesirably declined. There is a gap between the chamber lid 12 and the ceiling 14 mounted on the chamber lid 12. A mixture of gases which mixes several gases with various flow rates is introduced into the gap for the temperature control of the lower surface of the ceiling 14 so that the undesirable particles accumulated during the process are prevented from attaching to the lower surface of the ceiling 14. Hydrogen ($H_2$) and nitrogen ($N_2$) are used for such a design, and a gas mass flow controller (MFC) is further used to adjust the flow rates and mixture of gases. In addition, the gap between the ceiling 14 and the chamber lid 12 would be maintained at 0.1 mm and uniform anywhere. Therefore, the mixed gases can evenly pass the gap so as to achieve the preferable uniformity of the temperature.

There are several kinds of combinations of the ceilings and chamber lids. One of them needs to use a special tooling for fastening a fixing ring onto the surface of a ceiling. However, the tolerances and positions of the whole combination after assembly would be depended on the various operations acted by different equipment engineers. Another of the kinds utilizes four rotatable grapping hooks to grasp the corresponding interlock portions of the ceiling. Since the four rotatable grapping hooks are easily unbalanced when they are moved after holding the ceiling, the levelness of the ceiling accordingly gets worse. Therefore, the uniformity of the flow of the foregoing mixed gases is also negatively affected.

In view of above, the semiconductor manufacturers are in very need of a vapor phase film deposition apparatus used to resolve the foregoing problems of the difficult assembling and uneven gas flow. Accordingly, the quality of the deposited thin film is improved.

SUMMARY OF THE INVENTION

The present application provides an assembly of a chamber lid and a ceiling for semiconductor processes. The efficiency of the assembling is increased by modifying the fastening mechanism of a ceiling with automatically mechanical aligning and interlocking parts.

The present application provides a vapor phase film deposition apparatus in order to improve the matching tolerances of the both assembled ceiling and chamber lid and the levelness of the ceiling. Therefore, the problem of the uniform flow of mixed gases may be resolved.

In view of above aspects, the present application provides an assembly of a chamber lid and a ceiling for semiconductor processes as an embodiment. The assembly comprises a chamber lid including a recession; a ceiling including a plate and a support ring protruding from the middle of the plate; and a retaining mechanism contained by the recession of the chamber lid, the retaining mechanism including a pair of arms, a pair of connecting members respectively connected to the arms, a pair of linkages respectively enabling the connecting members to move toward different directions and a driver driving the linkages to move relative to each other, wherein the arms accordingly retain the support ring when the connecting members move toward and close to each other along different directions.

In another embodiment, the retaining mechanism further includes a guiding portion with two guiding grooves and the connecting members move respectively along the guiding grooves toward different directions.

In another embodiment, the support ring includes an annular body and a flange disposed on a side of the annular body. The pair of arms are engaged into a room between the annular body and the flange to retain the support ring.

In another embodiment, a side of each of the linkages is connected to the driver. The pair of connecting members move to close or away from each other along different directions so that the pair of connecting members retain or release the support ring when the driver rotates clockwise or counterclockwise.

The present application further provides a film deposition apparatus for semiconductor processes. The apparatus comprises a reactor including a chamber lid with a recession; a ceiling including a plate centrally having an opening and a support ring protruding from the opening of the plate; and a retaining mechanism contained by the recession of the chamber lid, the retaining mechanism including a pair of arms, a pair of connecting members respectively connected to the arms, a pair of linkages respectively enabling the connecting members to move along different directions and a driver driving the linkages to move relative to each other, wherein the arms accordingly retain the support ring when the connecting members move toward and close to each other along different directions; and a gas injector disposed within the opening of the plate.

In another embodiment, the gas injector comprises a gas passage portion which extends from the opening of the plate and the chamber lid.

In another embodiment, the retaining mechanism further includes a guiding portion with two guiding grooves and the connecting members move respectively along the guiding grooves toward different directions.

In another embodiment, a side of each of the linkages is connected to the driver. The pair of connecting members move to close or away from each other along different directions so that the pair of connecting members retain or release the support ring when the driver rotates clockwise or counterclockwise.

BRIEF DESCRIPTION OF THE DRAWINGS

In order to sufficiently understand the essence, advantages and the preferred embodiments of the present invention, the following detailed description will be more clearly understood by referring to the accompanying drawings.

DETAILED DESCRIPTION OF THE INVENTION

The following description shows the preferred embodiments of the present invention. The present invention is described below by referring to the embodiments and the figures. Thus, the present invention is not intended to be limited to the embodiments shown, but is to be accorded the principles disclosed herein. Furthermore, that various modifications or changes in light thereof will be suggested to persons skilled in the art and are to be included within the spirit and purview of this application and scope of the appended claims.

Figure 1:
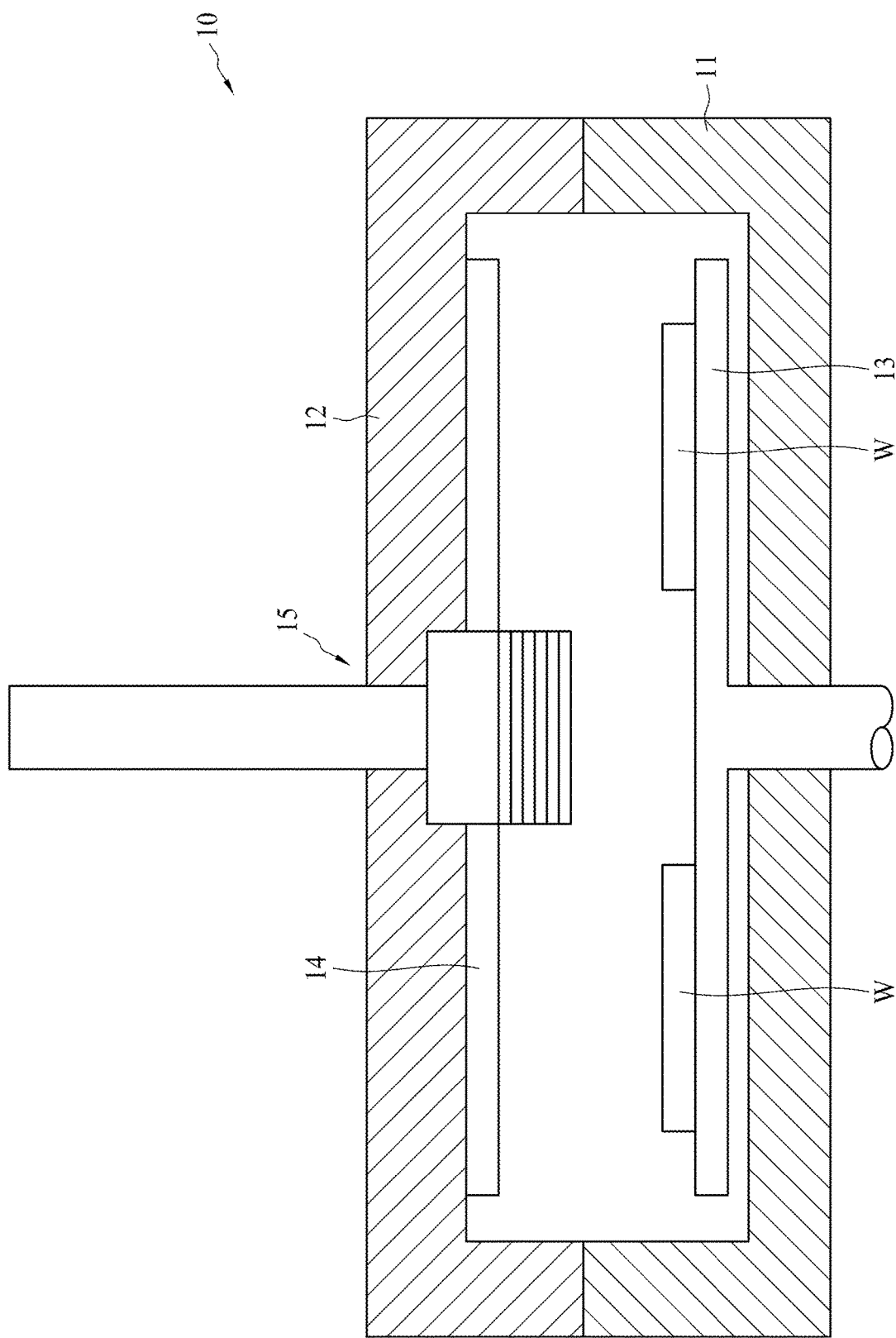
FIG. 1 is a schematic cross-sectional diagram which shows the conventional reactor of a film deposition apparatus.
Figure 2:
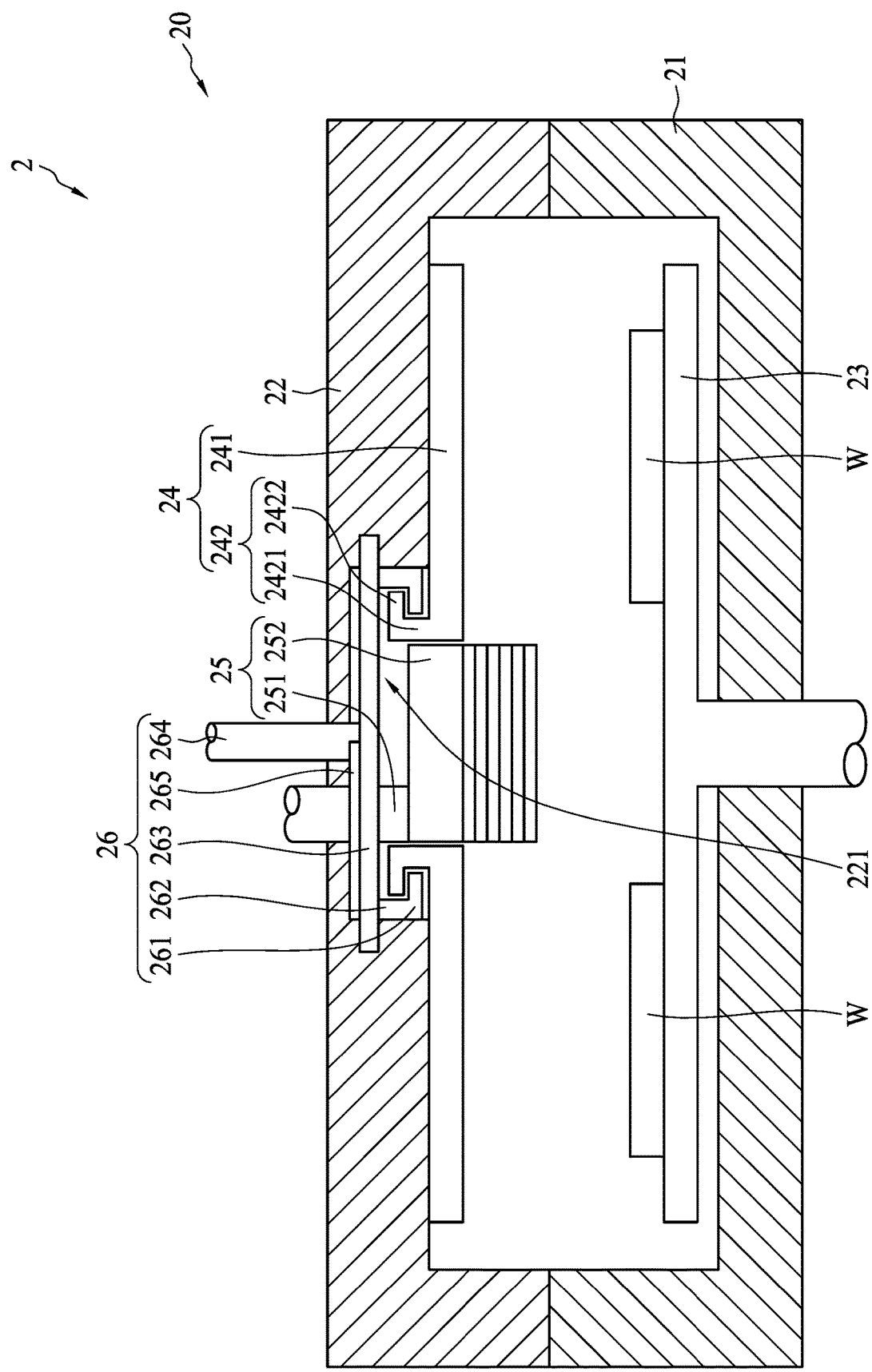
FIG. 2 is a schematic cross-sectional diagram which shows the reactor of a film deposition apparatus in accordance with an embodiment of the present application.

FIG. 2 is a schematic cross-sectional diagram which shows the reactor of a film deposition apparatus in accordance with an embodiment of the present application. As shown in this figure, the reactor 20 of a film deposition apparatus 2 is just an example for the growth of group III-V compound semiconductor. A closed chamber near vacuum is enclosed by chamber walls 21 and a chamber lid 22. Furthermore, the chamber lid 22 includes a recession 221 capable of containing a retaining mechanism. A substrate sustaining member 23 is disposed within the chamber, and is used to carry and hold at least one substrate W. A ceiling (i.e. an opposing face member) 24 is disposed opposing to the substrate sustaining member 23. A gas injector 25 is disposed at the center of the chamber lid 22.

The ceiling 24 includes a plate 241 and a support ring 242 protruding from the middle of the plate 241, and the support ring 242 includes an annular body 2421 and a flange 2422 disposed on a side of the annular body 2421. The gas injector 25 comprises a gas passage portion 251 capable of delivering source gases of groups III and V and a flow injection portion 252 in communication with the gas passage portion 251. The gas injector 25 horizontally jets the gasses above a substrate W for mixing so that a film is then deposited on each substrate W through physical or chemical reactions induced by heating.

The film deposition apparatus 2 further comprises a retaining mechanism 26 contained by the recession 221 of the chamber lid 22. The retaining mechanism 26 includes a pair of arms 261 capable of being embedded into a room between the annular body 2421 and the flange 2422, a pair of connecting members 262 respectively connected to the arms 261, a pair of linkages 263 respectively enabling the connecting members to move toward different directions, a driver 264 driving the linkages 263 to move relative to each other, and a guiding portion 265. As shown in this figure, the gas passage portion 251 of the gas injector 25 protrudes outward from the opening at the center of the plate 241 and the middle of the paired arms 261, and extends beyond the chamber lid 22 to be in communication with a source supply of source gases.

In this embodiment, the driver 264 looks like a round rod. A side of the rod is connected to a motor or an actuator so as to have a rotation motion. By controlling the driver 264 to rotate clockwise or counterclockwise, the paired arms 261 can move respectively toward different or opposite directions. For example, the linkages 263 move toward and close to each other along different directions as being guided by the guiding portion 265 when the driver 264 counterclockwise rotates. Accordingly, the paired arms 261 firmly hold the support ring 242. That is, the front ends of the paired arms 261 are embedded into a room between the annular body 2421 and the flange 2422 so that the ceiling 24 on robot's arm (not shown in this figure) is grasped and delivered to a certain location for assembly. By contrast, the linkages 263 move toward and are away from each other along different directions as being guided by the guiding portion 265 when the driver 264 clockwise rotates. Accordingly, the paired arms 261 are released from the support ring 242. That is, the front ends of the paired arms 261 leave the room between the annular body 2421 and the flange 2422 so that the ceiling 24 is released and put on robot's arm. This embodiment is just exemplary, but does not limit the claimed invention of the application. The members of the retaining mechanism 26 having relatively rotating motion or linear motion may be replaced with an equivalent linkage set.

Figure 3:
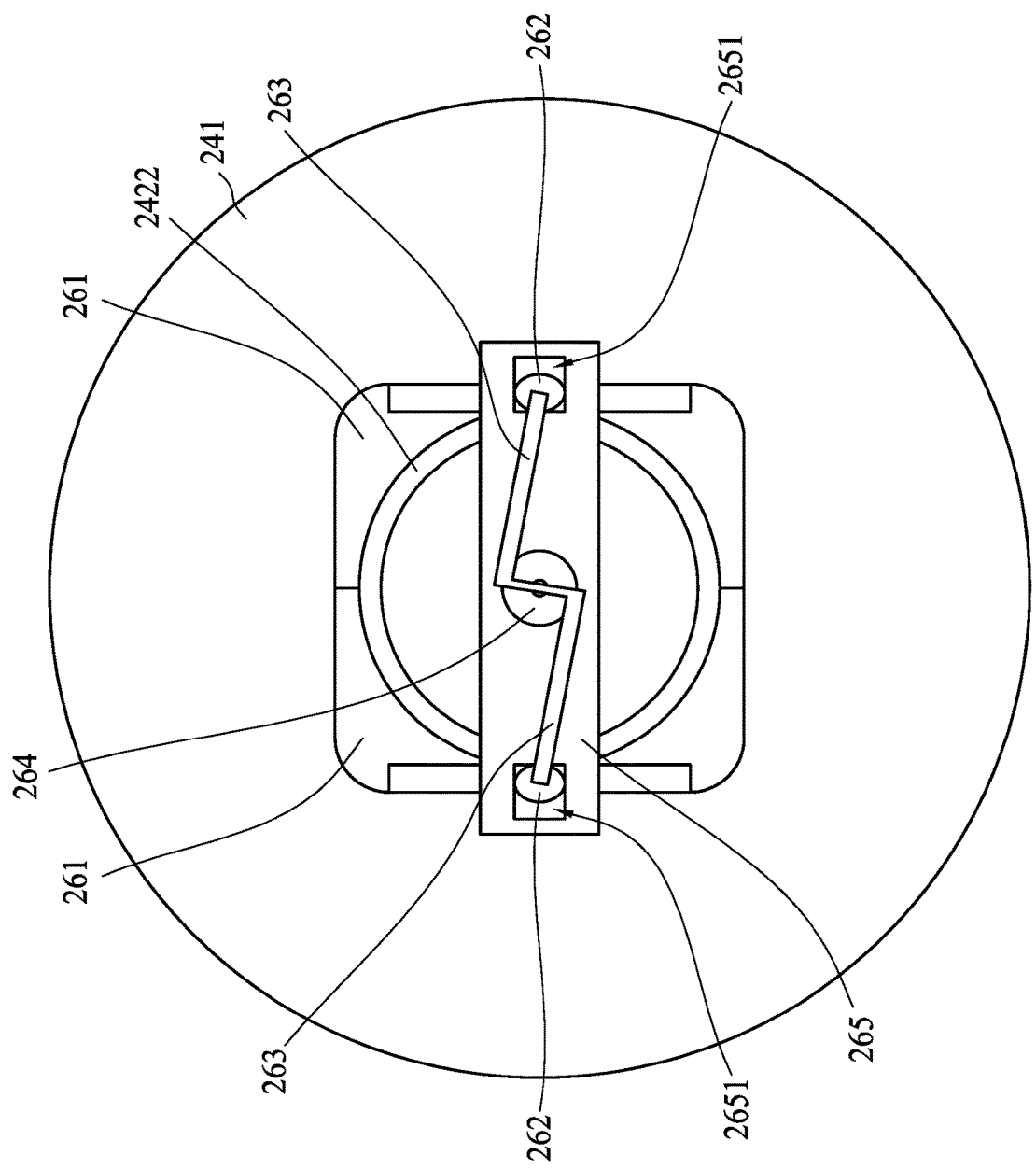
FIG. 3 illustrates a schematically top view of the retaining mechanism retaining the ceiling in FIG. 2.

FIG. 3 illustrates a schematically top view of the retaining mechanism retaining the ceiling in FIG. 2. As shown, in order to clearly show the relative positional relationship of the retaining mechanism 26 to the top plate 24, the chamber lid 22 is removed from the view for clear illustration. When the driver 264 rotates counterclockwise, the pair of connecting members 262 are moved toward the central direction by the guiding of the guiding portion 265 to approach each other. Accordingly, the paired arms 261 respectively connected to the pair of connecting members 262 clamp and fix the support ring 242. Accordingly, the front end of the paired arms 261 enters the room formed by the annular body 2421 and the flange 2422, whereby the two symmetrical arms 261 securely clamp the ceiling 24. Since the front end of the paired arms 261 is annular, the annular body 2421 and the flange 2422 are even supported. In this regard, such a mechanism solves the problem of poor levelness (or planarity) due to point support in the prior art, and further achieves the effect of automatic alignment and calibration.

The guiding portion 265 includes two rectangular guiding grooves 2651, and the connecting members 262 are respectively slidably in a guiding groove 2651. When the pair of connecting members 262 slid inward to a first position, the pair of arms 261 connected to the connecting members 263 clamp and fix the support ring 242.

Figure 4:
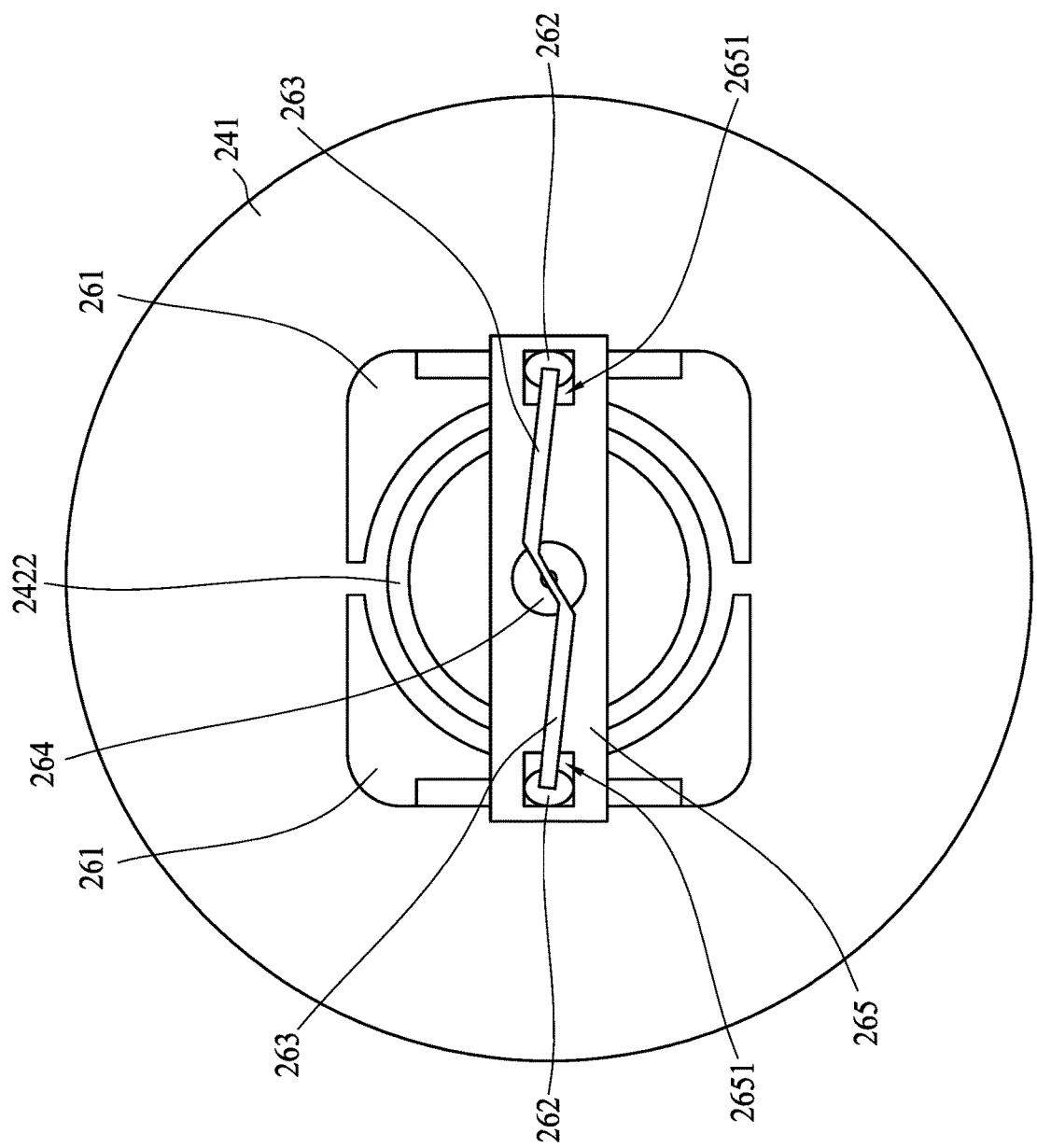
FIG. 4 illustrates a schematically top view of the retaining mechanism releasing a ceiling in FIG. 2.

FIG. 4 illustrates a schematically top view of the retaining mechanism releasing a ceiling in FIG. 2. When the driver 264 rotates clockwise, the pair of connecting members 263 are moved away from each other respectively toward two lateral directions by the guiding of the guiding portion 265. Consequently, the pair of arms 261 respectively connected to the pair of connecting members 263 are disengaged and released from the support ring 242. In this regard, the front ends of the paired arms 261 are separated from the room formed by the annular body 2421 and the flange 2422, whereby the two symmetrical arms 261 release the ceiling 24. That is, when the pair of connecting members 262 slid outward to a second position, the pair of arms 261 connected to the connecting members 263 are disengaged and released from the support ring 242 so that there is a gap between the two arms 261.

The foregoing embodiments of the invention have been presented for the purpose of illustration. Although the invention has been described by certain preceding examples, it is not to be construed as being limited by them. They are not intended to be exhaustive, or to limit the scope of the invention. Modifications, improvements and variations within the scope of the invention are possible in light of this disclosure.

What is claimed is:

1. An assembly of a chamber lid and a ceiling for semiconductor processes, the assembly comprising:
   the chamber lid including a recession;
   the ceiling including a plate and a support ring protruding from the middle of the plate; and
   a retaining mechanism contained by the recession of the chamber lid, the retaining mechanism including:
   a pair of arms;
   a pair of connecting members respectively connected to the pair of arms;
   a pair of linkages respectively enabling the pair of connecting members to move toward different directions; and
   a driver driving the pair of linkages to move relative to each other;
   wherein the pair of arms accordingly retain the support ring when the pair of connecting members move proximate to each other along different directions.

2. The assembly of the chamber lid and the ceiling for semiconductor processes according to claim 1, wherein the retaining mechanism further includes a guiding portion with two guiding grooves and the pair of connecting members move respectively along the two guiding grooves toward different directions.

3. The assembly of the chamber lid and the ceiling for semiconductor processes according to claim 2, wherein the support ring includes an annular body and a flange disposed on a side of the annular body.

4. The assembly of the chamber lid and the ceiling for semiconductor processes according to claim 3, wherein the pair of arms are engaged into a room formed between the annular body and the flange to retain the support ring.

5. The assembly of the chamber lid and the ceiling for semiconductor processes according to claim 1, wherein a side of each of the pair of linkages is connected to the driver and the pair of connecting members move to close or away from each other along different directions so that the pair of connecting members retain or release the support ring when the driver rotates clockwise or counterclockwise.

6. A film deposition apparatus for semiconductor processes comprising:
   a reactor including a chamber lid with a recession;
   a ceiling including a plate centrally having an opening and a support ring protruding from the opening of the plate;
   a retaining mechanism contained by the recession of the chamber lid, the retaining mechanism including:
   a pair of arms;
   a pair of connecting members respectively connected to the pair of arms;
   a pair of linkages respectively enabling the pair of connecting members to move along different directions;
   a driver driving the pair of linkages to move relative to each other;
   wherein the pair of arms retain the support ring when the pair of connecting members move toward and proximate to each other along different directions; and
   a gas injector disposed within the opening of the plate.

7. The film deposition apparatus for semiconductor processes according to claim 6, wherein the gas injector comprises a gas passage portion which extends outward from the opening of the plate and the chamber lid.

8. The film deposition apparatus for semiconductor processes according to claim 6, wherein the retaining mechanism further includes a guiding portion with two guiding grooves and the pair of connecting members move respectively along the two guiding grooves toward different directions.

9. The film deposition apparatus for semiconductor processes according to claim 6, wherein the support ring includes an annular body and a flange disposed on a side of the annular body.

10. The film deposition apparatus for semiconductor processes according to claim 9, wherein the pair of arms are engaged into a room formed between the annular body and the flange to retain the support ring.

11. The film deposition apparatus for semiconductor processes according to claim 10, wherein a side of each of the pair of linkages is connected to the driver and the pair of connecting members move to or away from each other along different directions so that the pair of connecting members retain or release the support ring when the driver rotates clockwise or counterclockwise.

* * * * *